(12) United States Patent
Stoddard et al.

(10) Patent No.: US 6,576,060 B1
(45) Date of Patent: Jun. 10, 2003

(54) PROTECTIVE GAS SHIELD APPARATUS

(75) Inventors: D. Neil Stoddard, Santa Cruz, CA (US); Soon K. Yuh, Scotts Valley, CA (US)

(73) Assignee: ASML US, Inc., Scotts Valley, CA (US)

( * ) Notice: Subject to any disclaimer, the term of this patent is extended or adjusted under 35 U.S.C. 154(b) by 0 days.

(21) Appl. No.: 09/574,826

(22) Filed: May 19, 2000

Related U.S. Application Data

(60) Provisional application No. 60/135,362, filed on May 21, 1999.

(51) Int. Cl.[7] ............................................. C23C 16/00
(52) U.S. Cl. ..................................... 118/715; 118/718
(58) Field of Search ............................... 118/715, 718, 118/719, 729

(56) References Cited

U.S. PATENT DOCUMENTS

| | | | |
|---|---|---|---|
| 4,834,020 A | 5/1989 | Bartholomew et al. ..... | 118/719 |
| 5,136,977 A | 8/1992 | Bouayad-Amine et al. . | 118/723 |
| 5,487,784 A | 1/1996 | Ellis, Jr. ..................... | 118/718 |
| 5,683,516 A | 11/1997 | DeDontney et al. ........ | 118/718 |
| 5,849,088 A | 12/1998 | DeDontney et al. ........ | 118/719 |
| 5,944,900 A | 8/1999 | Tran ............................ | 118/715 |
| 6,022,414 A | 2/2000 | Miller et al. ................ | 118/718 |
| 6,056,824 A | 5/2000 | Bartholomew et al. ..... | 118/719 |
| 6,220,286 B1 * | 4/2001 | Davenport .............. | 137/561 A |

* cited by examiner

Primary Examiner—Gregory Mills
Assistant Examiner—Karla Moore
(74) Attorney, Agent, or Firm—Dorsey & Whitney LLP

(57) ABSTRACT

A gas shield assembly for protecting an exposed surface of an injector in a chemical vapor deposition system. The shield assembly includes a back wall which supports perforated sheets to define a plenum. The sheets are held in place by endcaps. A conduit delivers gas to the plenum. The conduit includes a stretch extending along the back wall and has a bend adjacent the ends of the back wall. The conduit includes perforations along the stretch and at the bends to provide substantially uniform flow of gas into the plenum and the ends.

8 Claims, 3 Drawing Sheets

PROTECTIVE GAS SHIELD APPARATUS

RELATED APPLICATIONS

This application claims priority to Provisional Application Serial No. 60/135,362 filed May 21, 1999, the entire disclosure of which is hereby incorporated by reference.

FIELD OF THE INVENTION

The present invention relates in general to a chemical vapor deposition apparatus and, more particularly, to a protective gas shield apparatus for use during chemical vapor deposition processing.

BACKGROUND OF THE INVENTION

Chemical vapor deposition (CVD) systems are used to form a thin, uniform layer or film on a substrate such as a semiconductor wafer. During CVD processing, the substrate is exposed to one or more chemical vapors such as silane, phosphane, diborane and the like, and gaseous substances such as oxygen. The gases mix and interact with the other gases and/or the surface of the substrate to produce the desired film. The desired reactions generally occur at elevated temperatures, for example 300–550° C., with the substrate and chamber being heated to the appropriate temperature for a selected process. In many applications including semiconductor processing, film characteristics such as purity and thickness uniformity must meet high quality standards. The substrate is positioned in a clean, isolated reaction chamber to obtain high quality films. CVD systems typically employ injectors which deliver the gaseous substances directly to the surface of the substrate. An exhaust system removes waste products such as unreacted gases and powders formed during the reaction from the reaction chamber. The reaction chamber must be periodically cleaned to remove films which are deposited on the exposed surfaces of the chamber over time, eliminating sources of particulate contamination which may become embedded in the film or degrade the film thickness uniformity.

The injection ports are typically positioned less than one inch from the surface of the substrate, for example ⅛ inch to ½ inch. With this limited clearance between the injector and the substrate surface, the surfaces of the injector will become coated with the material produced during the reactions. To reduce the amount of build-up in this area, some CVD systems include protective shields which are positioned in front of the injectors and exhaust port. An inert gas such as nitrogen is delivered through a perforated screen carried by the shield to slow the rate at which materials accumulate on shield. The high temperatures in the CVD reaction chamber create thermal stresses in the perforated screen which may cause the screen to buckle after a period of time. The buckling disrupts the uniform flow of nitrogen through the screen as well as disturbing gas flow within the chamber, leaving portions of the screen unprotected against the accumulation of deposition materials. The ability of the screen to deliver nitrogen to the reaction chamber is further reduced as the screen becomes coated with deposition materials, requiring removal and cleaning or replacement of the shield.

A number of protective shield configurations have been disclosed in U.S. Pat. Nos. 5,849,088 and 5,944,900, the entire disclosures of which are hereby incorporated by reference herein. The descriptions provide specific design details that enhance the performance of the shields. In particular, useful life of the shield becomes extended through the use of these inventive ideas. Several of the ideas have been shown to improve the film uniformity.

While the protective shields described in these patents provide improved film uniformity, additional improvements are desired. For example, the protective shields as described include inert gas lines that enter the shield plenum near the end of the shield and then run down the length of the shield to the other end. The CVD system configuration typically requires the inert gas line to run down toward the shield, bend and then run along its length, and then bend back upward and exit from the assembly. Typically, the gas line has a series of holes which are usually, but not necessarily, evenly spaced along the length of the shield between the bends of the tube. The holes are not positioned in the bend area. While this design has proven to be superior to earlier designs, the bends in the tube are nonzero in lengths, and the first hole is placed where the tube becomes straight again. This results in low gas flow at the ends of the shield, and increased undesirable buildup of material in this region.

As mentioned above, high temperatures in the CVD reaction chamber create thermal stresses in the perforated screen. Over time this causes the screen to buckle and/or break. Prior art designs have addressed this problem. For example, U.S. Pat. No. 5,849,088 describes a protective shield that provides for expansion and contraction of the perforated front wall. While this is a significant advance, the assembly is relatively complex and can be expensive to manufacture.

Accordingly, it is desirable to provide an improved protective gas shield apparatus which minimizes build-up of materials at the ends, and which permits expansion and contraction of the perforated front wall in a less costly assembly.

OBJECTS AND SUMMARY OF THE INVENTION

It is a object of the present invention to provide a protective gas shield apparatus for use during chemical vapor deposition processing, and in particular to provide a gas shield assembly for protecting the exposed surfaces of a gas injector.

It is a further object of the present invention to provide a gas shield assembly which provides substantially uniform inert gas flow along the length of the shield.

It is a further object of the present invention to provide a simplified, less costly gas shield assembly which permits expansion and contraction of the perforated front wall.

The foregoing and other objects of the invention are achieved by a protective gas shield comprising a shield body having a back wall with flanges extending from the sides and ends of said body with a perforated sheet supported spaced from said back wall by said flanges whereby the back wall and perforated sheet form a plenum. At least one conduit is spaced inwardly from the sides of said shield body extending into said plenum for supplying an inert gas to said plenum whereby the gas flows outwardly through said perforated sheet. A retainer engages each end of said body and the edge of said perforated sheet to hold the perforated sheet on the shield body, while permitting expansion and contraction of the perforated sheet.

It is another object of the present invention to provide a shield assembly with removable and replaceable perforated front walls.

It is still another object of the present invention to provide a shield assembly which has prolonged life and which can be efficiently and economically manufactured and maintained.

BRIEF DESCRIPTION OF THE DRAWINGS

Additional objects and features of the invention will be more readily apparent from the following detailed description and appended claims when read in conjunction with the drawings of which:

DESCRIPTION OF PREFERRED EMBODIMENT

Figure 1:
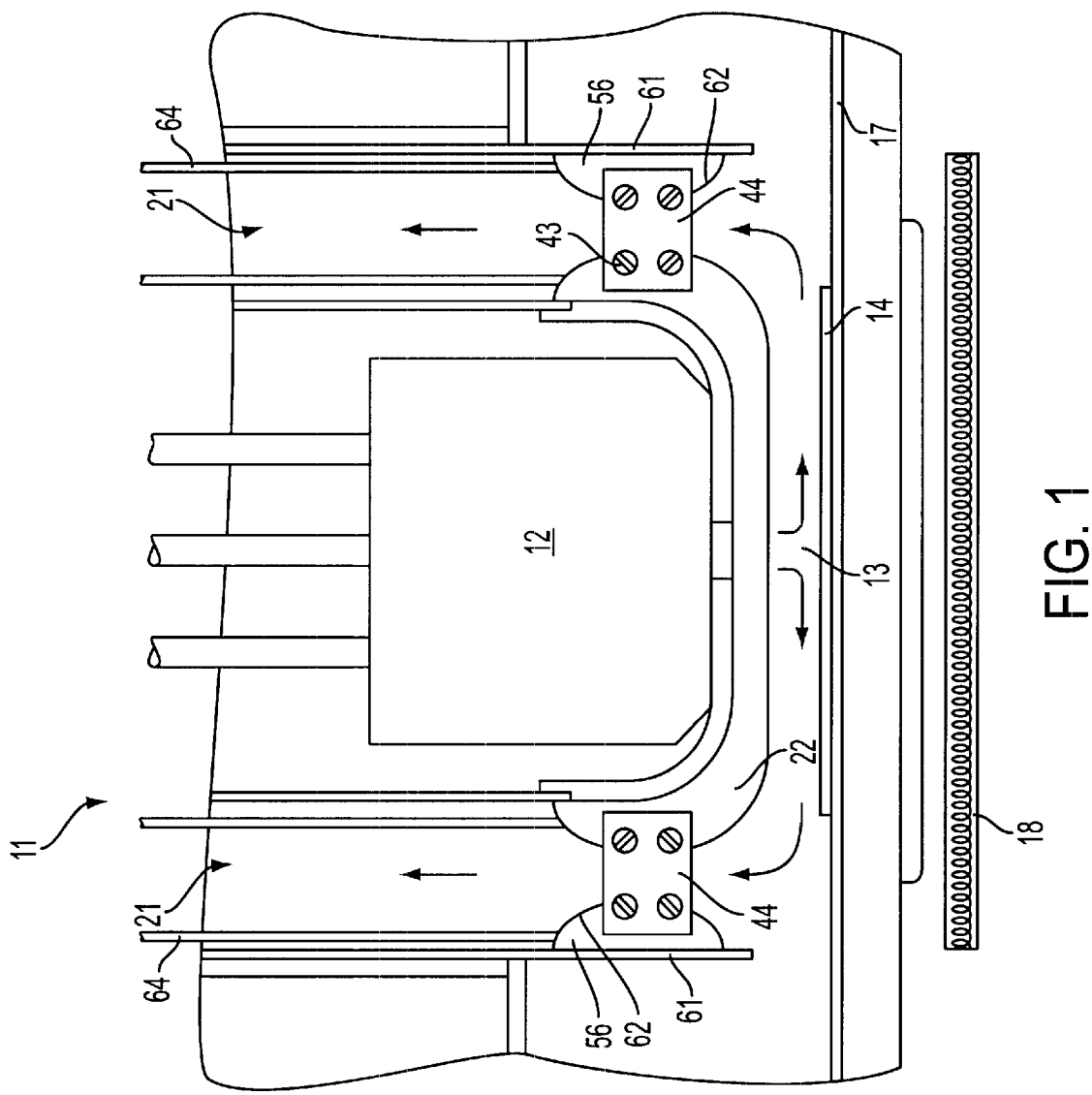
FIG. 1 is a schematic view of a processing module or chamber of a CVD system illustrating the gas shield of the present invention.
Figure 2:
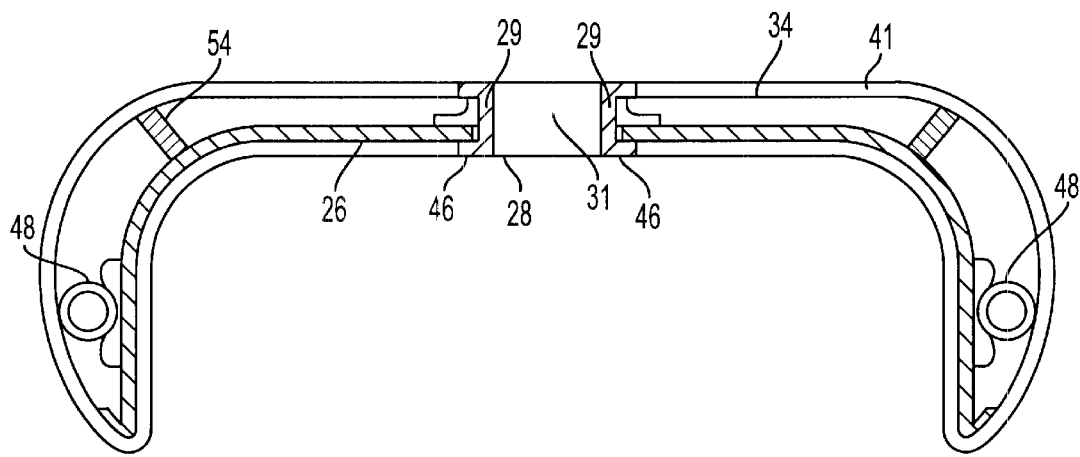
FIG. 2 is a sectional view of the gas shield assembly of the present invention.
Figure 3:
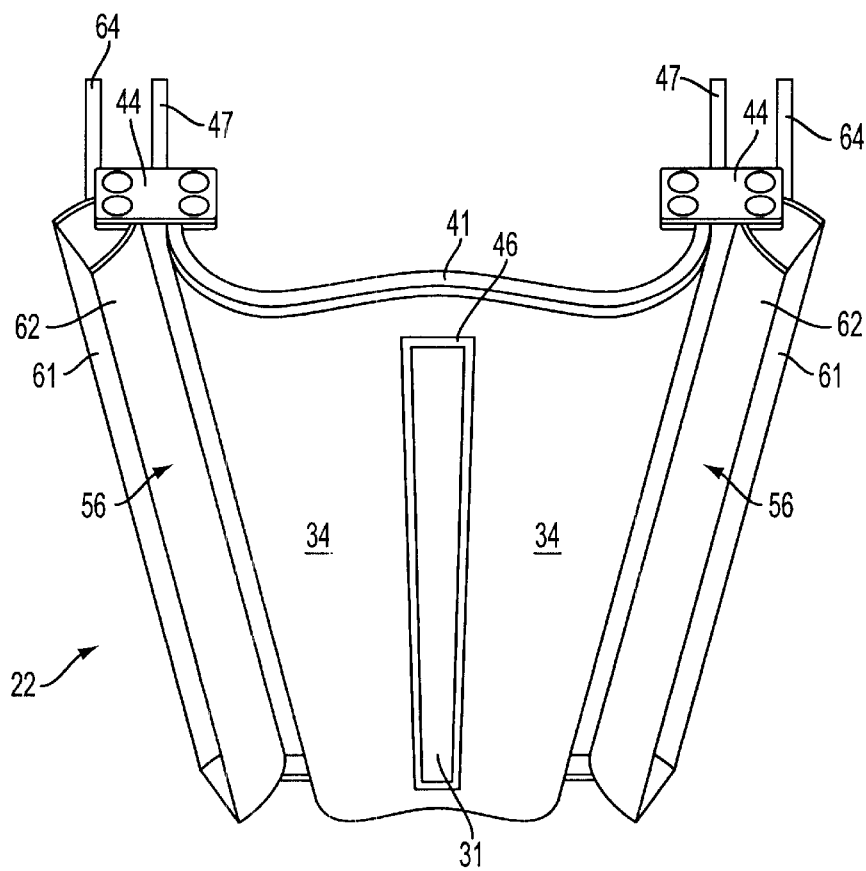
FIG. 3 is a perspective view of the shield apparatus of the present invention.

FIG. 1 schematically illustrates a processing module or chamber 11 which is positioned along the path of a CVD processing system such as that described in U.S. Pat. No. 5,849,088 which is incorporated herein by reference in its entirety. The processing module 11 includes an injector 12 such as that shown in Pat. Nos. 5,683,516 or 6,022,414 for injecting chemical reagents or other gaseous substances into a reaction chamber or process area 13 directly below the injector 12. Wafers 14 to be processed are moved through the reaction chamber by a conveyor belt 17. The chamber may be heated by a heater 18 placed adjacent the reaction chamber.

As the wafer or substrate 14 is moved past the injector, the injected gases react with each other and with the upper surface of the substrate to form a thin uniform layer or film on the surface of the substrate. The waste products including reaction by-products and unreacted gases are exhausted through exhaust vents 21 which are coupled to an exhaust system.

As shown in FIG. 1, a protective shield assembly 22 is positioned in front of the exposed surface of the injector 12 and the inlets to the exhaust passage or exhaust vents 21. The shield separates the injector and exhaust passageways from the reactions occurring within the process chamber 13, preventing deposition of reaction by-products and other contaminants on the surface of the injector and passageways. The shield assembly also inhibits the accumulation of such by-products and contaminants on the surface of the shield so that most of the by-products are expelled from the process chamber into the exhaust system.

Figure 4:
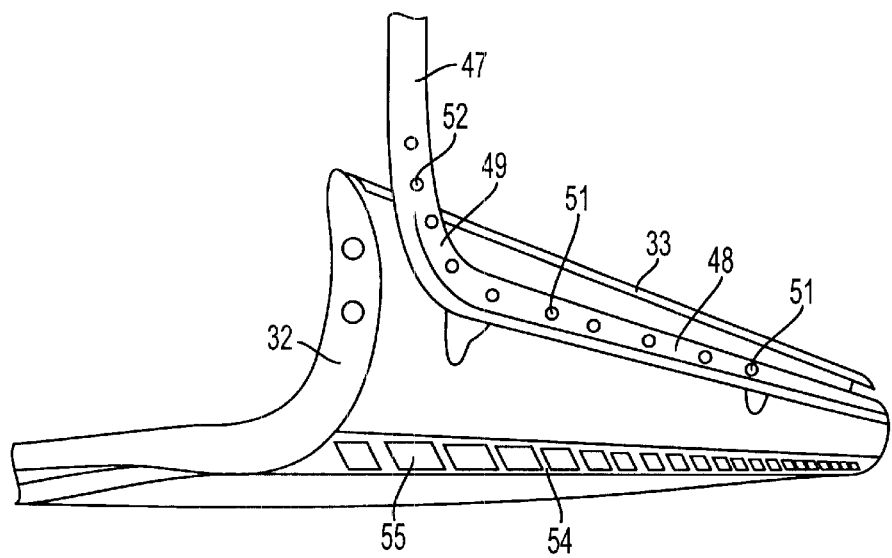
FIG. 4 is a perspective view of one half of the back wall of the shield apparatus showing the perforated gas delivery tube.
Figure 5:
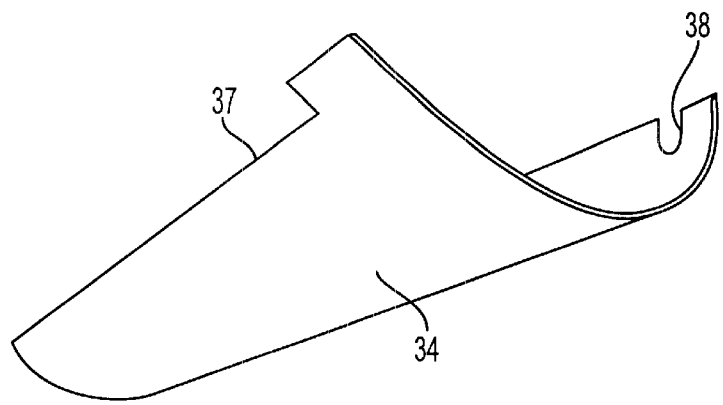
FIG. 5 is a perspective view of one perforated sheet section.
Figure 6:
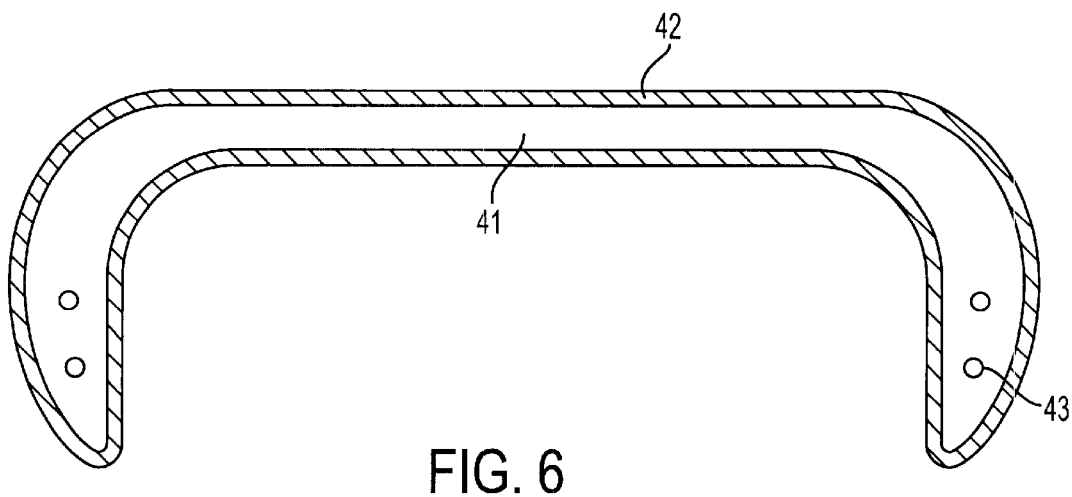
FIG. 6 shows the perforated sheet retaining cap.

As shown particularly in FIGS. 2–5, shield assembly 22 includes a back wall 26 which is positioned adjacent the front face of injector 12 and wraps around the outer edges of the injectors. The back wall includes a slot 28 which provides an inlet port for the flow of reagents into the processing chamber. The size, shape and configuration of the inlet port is dependent upon the design of the injector and its ports. The back wall of the shield is provided with flanges 29 at the slot 28 which define a passage 31. The side and end edges of the back wall are provided with end and side flanges 32 and 33. A perforated sheet 34 is positioned on top of the flanges 29, 32 and 33. Preferably, the perforated sheet is in two parts, one part of which is shown in FIG. 5. A cut-out 37 of the two parts cooperates to define a slot for the inlet port 31. A cut-out 38 accommodates the inert gas inlet conduits to be described. The two parts are placed over the flanges, and are retained by endcaps 41, as shown in FIG. 6. The endcaps have the same configuration as the ends of the back wall flanges, and include flanges 42 which engage the back wall and clamp the edges of the perforated sheets to the back wall flanges. The endcaps are retained by screws 43 which mount support 44 to the shield assembly as shown in FIG. 1. Clamps 46 resiliently clamp the edges of the perforated sheet slot to the inlet port flanges 29. Differences in thermal expansion of the perforated sheet and the back wall are accommodated by sliding movement of the perforated sheet with respect to the back wall. The space between the back wall and the perforated sheet forms a plenum. Inert gas delivered into the plenum flows through the perforations in the perforated sheets to inhibit deposit of reaction by-products onto the perforated sheet.

Referring to FIG. 4, the inert gas is delivered by conduits or pipes 47 located at each edge of the back wall. The pipes have a stretch 48 which extends lengthwise along and secured to the back wall as for example by welding. The stretch 48 is between bends 49 with the ends of the conduits extending upwardly to receive the inert gas from a gas supply. The stretch 48 is perforated 51 to permit the inert gas to flow uniformly along the plenum. In accordance with one feature of the present invention, the bends are also perforated 52 to allow inert gas to flow towards the ends of the plenum to inhibit deposits of by-products near the ends of the shield.

Support members 54 are welded on the back wall along the curved portion to prevent the perforated sheet from buckling. The support members extend between the ends of the shield body. A plurality of holes or slots 55 are formed in the support to permit the flow of inert gas along the plenum. It should be understood that the position of the support members, as well as the number of support members, may vary.

The shield assembly also includes shield bodies 56 supported outwardly from the upturned edges of the shield assembly 22 by the support 44. The shield bodies 56 and shield assembly 22 cooperate to form the entrance to the exhaust passage 21. The shield bodies 56 include a back 61 and a spaced perforated sheet 62 to form plenums therebetween. Inert gas is supplied to the plenums by pipes or conduits 64.

As is apparent from the foregoing, the present invention provides a simple, relatively inexpensive shield. The shield can accommodate changing temperature conditions without severe buckling or breaking of the perforated sheet. The shield assembly can be easily disassembled for cleaning and/or replacement of the perforated sheets. The inert gas flows evenly along the length and ends of the shield assembly.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention, and various embodiments with various modifications as are suited to the particular use are contemplated. It is intended that the scope of the invention be defined by the claims appended hereto and their equivalents.

What is claimed is:

1. A protective gas shield apparatus comprising
a shield body having a back wall;
a plurality of flanges positioned on said back wall proximate the side and end edges of said back wall, said flanges extending outwardly away from one side of said back wall;
at least one support member affixed to said back wall, said at least one support member having a plurality of holes;
a perforated sheet means supported spaced from said back wall by said flanges and said at least one support member, said back wall and perforated sheet forming a plenum, said perforated sheet means including two perforated sheets which mate to form said perforated sheet means;
at least two conduits extending into said plenum and each spaced inwardly from one side of said shield body for supplying an inert gas to said plenum whereby the gas flows outwardly from said perforated sheet; and
an endcap engaging each end of said body and the edge of said perforated sheet to hold the perforated sheet on the shield body, while permitting expansion and contraction of the perforated sheet.

2. A CVD processing system for performing chemical vapor deposition on substrate comprising:
a reaction chamber;
one or more injectors for injecting gaseous substances into said reaction chamber;
one or more exhaust vents for exhausting gases from said reaction chamber; and
one or more of the protective gas shields of claim 1, said one or more protective gas shields being positioned adjacent said one or more injectors.

3. The system of claim 2 wherein a conveyor belt moves said substrate through said reaction chamber.

4. The system of claim 2 wherein the one or more second protective gas shields of claim 1 are positioned adjacent said one or more exhaust vents.

5. A protective gas shield apparatus comprising a shield body having a back wall;
a plurality of flanges positioned on said back wall proximate the side and end edges of said back wall, said flanges extending outwardly away from one side of said back wall;
at least one support member affixed to said back wall, said at least one support member having a plurality of holes;
a perforated sheet means supported spaced from said back wall by said flanges and said at least one support member, said back wall and perforated sheet forming a plenum;
at least two conduits extending into said plenum and each spaced inwardly from one side of said shield body for supplying an inert gas to said plenum whereby the gas flows outwardly from said perforated sheet, each of said conduits having a stretch extending along said back wall adjacent the edge of said back wall, and a bend adjacent the ends of said back wall, and each of said conduits including perforations along the stretch and at the bends to provide substantially uniform flow of gas into said plenum and ends; and
an endcap engaging each end of said body and the edge of said perforated sheet to hold the perforated sheet on the shield body, while permitting expansion and contraction of the perforated sheet.

6. A CVD processing system for performing chemical vapor deposition on a substrate comprising:
a reaction chamber;
one or more injectors for injecting gaseous substances into said reaction chamber;
one or more exhaust vents for exhausting gases from said reaction chamber; and
one or more of the protective gas shields of claim 5, said one or more protective gas shields being positioned adjacent said one or more injectors.

7. The system of claim 6 wherein a conveyor belt moves said substrate through said reaction chamber.

8. The system of claim 6 wherein the one or more second protective gas shields claim 3 are positioned adjacent said one or more exhaust vents.

* * * * *